United States Patent [19]

Irvin

[11] 4,242,632
[45] Dec. 30, 1980

[54] METHOD AND APPARATUS FOR TESTING AXIAL-LEAD COMPONENTS

[75] Inventor: Robert A. Irvin, Sudbury, Mass.

[73] Assignee: Semicon, Inc., Burlington, Mass.

[21] Appl. No.: 940,966

[22] Filed: Sep. 11, 1978

[51] Int. Cl.³ .................. G01R 31/02; G01R 31/26
[52] U.S. Cl. ............................ 324/73 R; 324/51; 324/158 D
[58] Field of Search .............. 324/51, 54, 62, 66, 324/73 R, 73 AT, 73 PC, 149, 158 P, 158 F, 158 D

[56] References Cited

U.S. PATENT DOCUMENTS

| | | | |
|---|---|---|---|
| 2,379,947 | 7/1945 | Bandur | 324/54 |
| 2,642,481 | 6/1953 | Wilson | 324/66 X |
| 2,663,844 | 12/1953 | Earle et al. | 324/54 X |
| 2,925,553 | 2/1960 | Shillington | 324/73 AT |
| 3,115,235 | 12/1963 | Othon | 324/73 AT |
| 3,422,354 | 1/1969 | Webb | 324/158 F |
| 3,629,702 | 12/1971 | Henken | 324/73 AT |
| 4,012,693 | 3/1977 | Sullivan | 324/73 PC |
| 4,056,773 | 11/1977 | Sullivan | 324/73 PC |

*Primary Examiner*—Gerard R. Strecker
*Attorney, Agent, or Firm*—Cesari & McKenna

[57] ABSTRACT

A method and apparatus for pre-stress testing a large number of electrical components having axial leads. The components are aligned in parallel so that the leads at one end terminate in approximately one plane and the leads at the other end terminate approximately in a second plane parallel to the first one. A pair of planar electrodes are applied to the respective ends of the leads and the electrodes are connected to the power source that applies the desired test voltage.

5 Claims, 3 Drawing Figures

U.S. Patent     Dec. 30, 1980     4,242,632
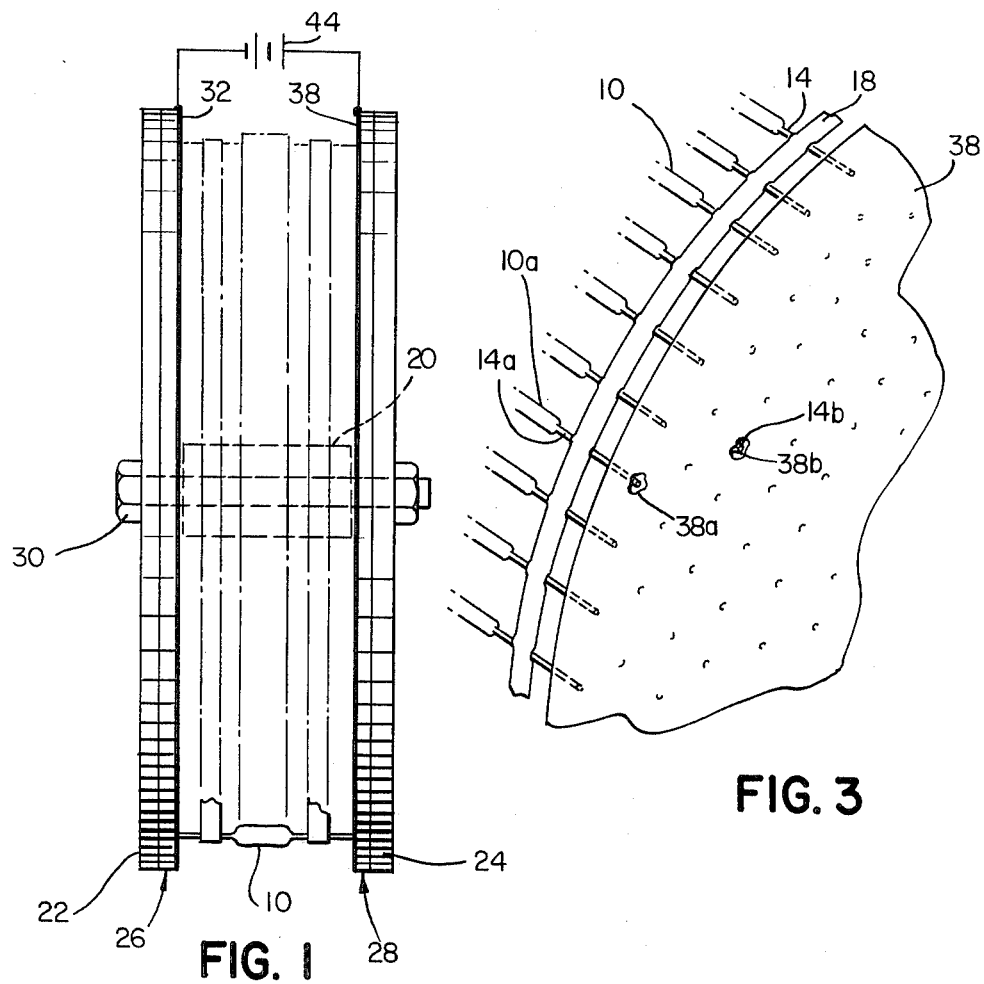
FIG. 1
FIG. 3
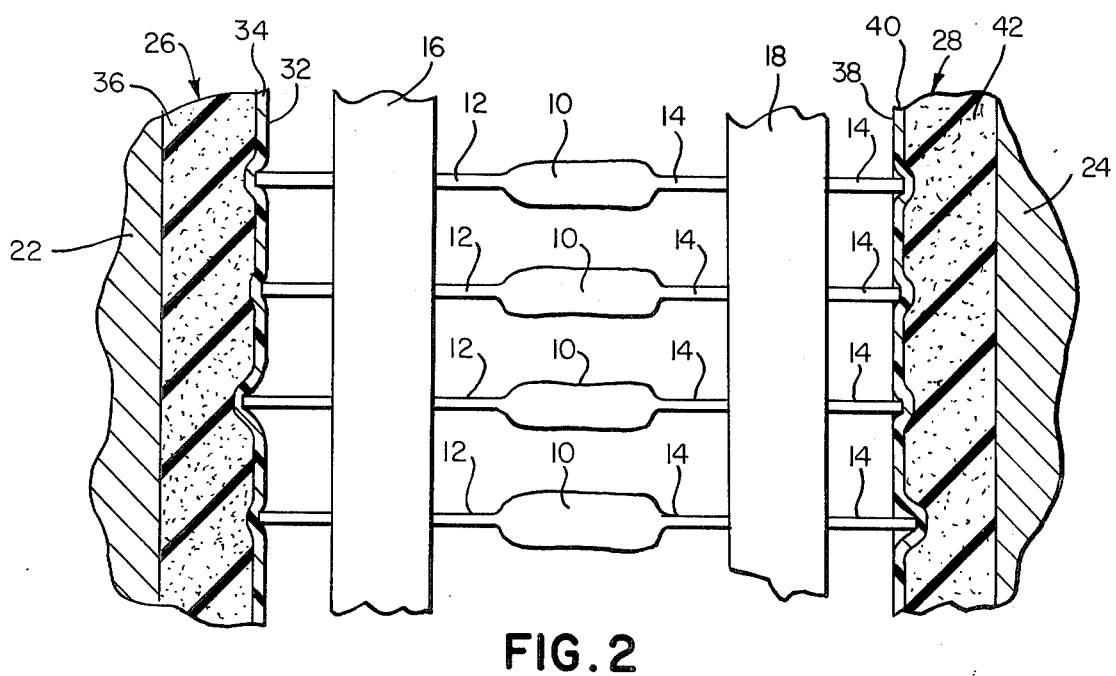
FIG. 2

METHOD AND APPARATUS FOR TESTING AXIAL-LEAD COMPONENTS

BACKGROUND OF THE INVENTION

This invention relates to the testing of electrical components. More specifically, it relates to a method and apparatus for the mass testing of components, such as semi-conductor diodes and the like, having axial leads.

It is well known that if various electrical components are tested by subjecting them to stress conditions, such as extreme voltage, temperature and humidity conditions, most of those components that are likely to fail in actual use will fail the test. By thus "weeding out" these components, the manufacturers of devices in which the components are used may obtain substantially improved reliability for those devices. This "prestressing" technique is universally applied to certain types of components used in military and space applications where high reliability is a primary concern. However, prior to the present invention, prestressing has been uneconomical for most commercial applications. This is because a test of this nature generally lasts for many hours, so that the cost of equipment or manpower to test large numbers of components is prohibitive when balanced against the economic return in terms of reliability.

SUMMARY OF THE INVENTION

It is a general object of the invention to provide a method and apparatus for the testing of electrical components.

More particularly the principle object of the invention is to provide for economical prestress testing of components at a sufficiently low cost to justify the use of this technique in commercial applications.

In accordance with the invention a large number of axial lead components are aligned in parallel so that the leads at one end terminate in approximately one plane and the leads at the other end terminate approximately in a second plane parallel to the first one. A pair of planar electrodes are applied to the respective ends of the leads and the electrodes are connected to the power source that applies the desired test voltage. The entire assembly may also be subjected to extreme environmental conditions such as high temperature and humidity. Following the tests the failed components are discarded; those that passed the test are used in their intended applications.

Since a large number of components are tested simultaneously, the cost per component for the prestress testing is relatively low in spite of the long duration of the test.

As a further feature of the invention, one or both of the electrodes that contact the component leads are in the form of thin, foil-like disposable conductors. Accordingly, whenever a component fails during the test, the abnormally high current drawn by that component melts or burns out the electrode at the point of contact with that conductor. This in turn disconnects the component from the testing apparatus and thereby permits the testing of all the other components to continue without interruption and at the same time reduces the power source capacity required to sustain fault current should multiple failures occur. The burned-out portion of the electrode provides a tell-tale indicator that the component has failed, thereby facilitating the removal of failed components at the end of the test.

Components having axial leads are conventionally mounted on tapes by the manufacturer thereof to facilitate machine handling and insertion of the components into circuit boards. Specifically, the components are mounted crosswise on the tapes and in parallel with each other. For conductors supplied in this fashion, I prefer to use a spool-like arrangement in which the tape is wound around a central hub, with electrodes fastened to the hub in the form of end flanges of the spool. This provides for very quick and convenient connection of the components into the test apparatus, with a resulting further economy of operation.

BRIEF DESCRIPTION OF THE DRAWINGS

FIG. 1 is an end view of a test fixture used in testing axial-lead components mounted on a tape;

FIG. 2 is an enlarged fragmentary view of the fixture of FIG. 1; and

FIG. 3 is an enlarged fragmentary view of FIG. 1, broken away to show the manner in which failure of components disconnects them from the test circuit.

DETAILED DESCRIPTION OF THE INVENTION

FIG. 1 illustrates a test fixture used for the mass pretesting of axial lead components that are tape-mounted by the manufacturer thereof. As shown in FIG. 1 and in more detail in FIG. 2, a series of axial lead components 10 are supplied in mutually a parallel orientation, with leads 12 adhesively adherred to a pair of tapes 16 and 18, respectively. Components are often supplied in this manner for automatic feeding into a component insertion machine (not shown) which removes the components 10 from the tapes 16 and 18 and inserts them into assigned locations on circuit boards. As further shown in FIG. 1, a series of such tape-mounted components are wound around a central hub 20. A pair of flanges 22 and 24, carrying electrode assemblies 26 and 28, are secured in place by means of a bolt 30 extending through the flanges and the hub 20.

As shown in FIG. 2, the electrode assembly 26 comprises an electrode 32 in the form of a thin metallic layer on a flexible plastic substrate 34. Preferably the the substrate 34 is a thin film and the electrode 32 is a coating on that film. The electrode 32 contacts the ends of the component leads 12, while the substrate 34 bears against a resilient disk 36 made of foamed silicon rubber, for example. The assembly 26 is held in place, as mentioned above, by the force exerted by the flange 22. The electrode assembly 28 similarly comprises an electrode 38, a plastic substrate 40 and a resilient disk 42. This construction of the electrode assemblies 26 and 28 assures that each of the leads 12 and 14 will be contacted by an electrode, even though the ends of the respective leads may be only approximately, and not exactly, coplanar.

With further reference to FIG. 1, the test fixture may be used by connecting it to a suitable voltage source, schematically shown as a battery 44. Specifically, the battery or power source is connected to the electrodes 32 and 38 so as to apply a voltage to each of the components 10 by way of the leads 12 and 14 connected to the electrodes. Furthermore, the test fixture may be placed in an enclosure (not shown) in which extreme temperature and humidity conditions are imposed so as to stress the components 10 under both appropriate voltage and environmental conditions simultaneously.

FIG. 3 shows what happens when a component fails under test. The component 10a, for example, has failed, resulting in abnormally high current through that component. This has caused the electrode 38 to melt or otherwise disintegrate in the region 38a of its contact with the component lead 14a. The component 10a has thus become disconnected from the electrode 38 and its failure has therefore not disrupted the testing of the other components 10. Furthermore, since the disintegration of the electrode in the region 38a is visible, it facilitates identification of the failed component 10a. Another failed component (not shown) having a lead 14b is also readily identified by disintegration of the electrode in the region 38b. Thus, after the testing of the components has been completed, the failed components are readily located and discarded.

It will be apparent that a number of variations in the test fixture may be made without departing from the scope of the invention. For example, for components that are not tape-mounted, one electrode can be a horizontal plate with holes drilled therein, each hole serving as a socket for one lead of a component to be tested. The other leads of the components can be connected by means of an electrode assembly, similar to the assemblies 26 and 28, having the desired resiliency to accommodate different component lead lengths. A fixture of that type will also be desirable in cases where the electrical stressing of the components causes so much heat dissipation that the heat cannot be readily removed in a fixture of the type shown in FIG. 1.

What is claimed as new and desired to be secured by Letters Patent of the United States is:

1. Apparatus for the simultaneous testing of a plurality of electrical components, each of which has first and second axial leads, said apparatus comprising
   a. first and second electrode assemblies having first and second spaced electrodes with substantially parallel, oppositely facing electrode surfaces, respectively;
   b. means rendering at least the first electrode resilient;
   c. means for positioning the components between the electrode surfaces;
   d. means for urging said first electrode into contact with the ends of said first leads and said second electrode into contact with the ends of said second leads;
   e. at least one of said electrodes being sufficiently thin that a failed component drawing excessive current therethrough will cause disintegration of said one electrode at the contact between said one electrode and a lead of said failed component, thereby disconnecting said failed component from said electrode.

2. The apparatus defined in claim 1 in which said one electrode is in the form of a metallic layer on a plastic film.

3. The apparatus defined in claim 1 in which
   a. said first electrode is in the form of a metallized plastic film; and
   b. said first electrode assembly includes
      i. a resilient disk bearing against said first electrode and
      ii. means for applying a force to said disk to urge said first electrode against said first leads.

4. Apparatus for the simultaneous testing of a plurality of electronic components, each of which has first and second axial leads, said apparatus comprising
   a. first and second spaced electrode assemblies having substantially parallel, oppositely facing surfaces;
   b. means for aligning said components substantially in parallel with each other between the surfaces of said electrode assemblies;
   c. means for urging said first and second electrode assemblies against the ends of said first and second leads, respectively;
   d. a source of electrical power connected to said electrodes so as to apply a voltage to all of said components simultaneously;
   e. at least one of said electrode assemblies including an electrode that is sufficiently thin that a failed component drawing excessive current therethrough will cause disintegration of said electrode at the contact between said electrode and a lead of said failed component, thereby disconnecting said failed component from said electrode.

5. A method for the simultaneous testing of a plurality of electrical components, each of which has first and second axial leads, said method comprising the steps of
   a. aligning said components substantially in parallel with each other between substantially parallel, oppositely facing surfaces of first and second spaced common electrodes;
   b. connecting a first common electrode to the ends of said first leads and a second common electrode to the ends of said second leads, at least one of said common electrodes being sufficiently thin that a failed component drawing excessive current therethrough will cause disintegration of said one electrode at the contact between said one electrode and a lead of said failed component, thereby disconnecting said failed component from said one electrode;
   c. connecting said electrodes to a power source so as to apply a voltage to all of said components simultaneously; and
   d. separating said failed components that become disconnected from said one electrode from said components that remain connected to said one electrode after the application of said voltage.

* * * * *